(12) United States Patent
DeSimone et al.

(10) Patent No.: US 8,330,775 B2
(45) Date of Patent: *Dec. 11, 2012

(54) SYSTEMS AND METHODS FOR MERGING AND SPLITTING INTERSECTING SOLIDS AND SURFACES

(75) Inventors: Frank DeSimone, Carlisle, MA (US); Constantin Sevici, Chelmsford, MA (US); Ken Mental, Mendon, MA (US)

(73) Assignee: Spaceclaim Corporation, Inc., Concord, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/484,558

(22) Filed: May 31, 2012

(65) Prior Publication Data

US 2012/0236028 A1 Sep. 20, 2012

Related U.S. Application Data

(63) Continuation of application No. 11/969,509, filed on Jan. 4, 2008, now Pat. No. 8,207,990.

(51) Int. Cl.
*G09G 5/377* (2006.01)

(52) U.S. Cl. ........................................ 345/630

(58) Field of Classification Search .................... 345/630
See application file for complete search history.

(56) References Cited

U.S. PATENT DOCUMENTS 8,207,990 B1 * 6/2012 DeSimone et al. ........... 345/630

* cited by examiner

*Primary Examiner* — Javid A Amini
(74) *Attorney, Agent, or Firm* — Wilmer Cutler Pickering Hale and Dorr LLP

(57) ABSTRACT

Embodiments of the invention relate to merging and splitting intersecting geometry-only solids and surfaces in an intuitive manner. One embodiment is a method of merging and cutting geometry-only format CAD objects without related history information, using a single geometry modification tool and interface. In response to receiving a group selection from the user, of a plurality of CAD objects, the method infers a merge operation and automatically merges the plurality of CAD objects into a single merged CAD object. In response to receiving an individual selection from the user of a CAD object, the geometry modification tool enters a merged state when the subsequent second selection from the user is selected in a manner indicating a merger operation, or alternatively, enters a cut state when the subsequent second selection from the user is selected in a manner indicating a cut operation.

4 Claims, 14 Drawing Sheets

SYSTEMS AND METHODS FOR MERGING AND SPLITTING INTERSECTING SOLIDS AND SURFACES

BACKGROUND OF THE INVENTION

1. Field of the Invention

This application is a continuation of application Ser. No. 11/969,509, filed on Jan. 4, 2008, entitled "SYSTEMS AND METHODS FOR MERGING AND SPLITTING INTERSECTING SOLIDS AND SURFACES," which is incorporated herein by reference. This invention relates to merging and splitting intersecting geometry-only solids and surfaces in an intuitive manner.

2. Prior Art

Objects in a CAD system can be represented in a parameter-based way or in a geometry-based way. In a parameter-based representation, the object is modeled as an object along with a set of features and history that define the object. In a geometry-based representation, the object is simply represented as a set of geometric data.

In modern CAD systems, geometry can be created in three basic ways: from manipulation of 2D sections, creation of edge features by modifications to the sharp boundaries between faces (e.g., a fillet), and combining and manipulating solid primitives using a set of Boolean operations. Over time, every major CAD tool has organized these combinatorial Booleans according to their inputs and desired output. This organization has resulted in many separate workflows located within separate features and tools to perform these functions. Moreover, since these CAD tools essentially force the user to make up a recipe of desired functions, and only then ask for the calculation to occur, the user never knows the result until the operation has concluded. Changes to a model that are made after a completed operation involve rolling the history of the model backwards and redefining the Boolean operation with different selections and/or options. This is a frustrating and time-consuming endeavor.

When editing a previously combined or split solid or surface in a parametric system, the process requires step-by-step re-creation of the original solids and/or surfaces. To modify the combined or split objects, changes must be rolled back, and the new change must be made before a user can return to the current step. This is a consequence of parametric systems having added many history features on top of the actual geometry modeling functionality. These systems have interwoven these features into the software so that making changes requires a lot of effort and additional steps to maintain the information in the step-by-step history. Specifically, they require editing the particular historical step that parameterized the object instead of changing the object itself. This method allows a user to modify a feature of an object only when the object is in the same state that it was in when the feature was created.

Other systems provide the combine and split actions using many different tools, as shown in the representative workflow of some example cases in FIG. 16. Occasional pre-selection is offered, and little logic is performed by the system to determine the user's intention. To select the correct tool, the user must know in advance which objects they want to merge and which tool is appropriate for those objects. In addition, the user must switch between tools when performing the same action (such as a merging) when the target and cutter objects are different types. The entire action must be completed to see the expected result; there is no preview of the appearance of the final object before regions are deleted.

SUMMARY OF THE INVENTION

Embodiments of the invention relate to merging and splitting intersecting geometry-only solids and surfaces in an intuitive manner. A first embodiment comprises a method of merging and cutting geometry-only format CAD objects stored within a computer aided design modeling system and without related history information, using a single geometry modification tool and interface. The method includes displaying a plurality of CAD objects and a plurality of geometry modification tools, including the single geometry modification tool, within a graphical user interface of the computer aided design modeling system. This method also includes receiving an activation, from a user of the computer aided design modeling system, of the single geometry modification tool, and in response to receiving a group selection, from the user, of a plurality of CAD objects while the single geometry modification tool is active, inferring a merge operation in response to the group selection from the user, and automatically merging the plurality of CAD objects into a single merged CAD object. In response to receiving an individual selection from the user of a first selected single CAD object, and while the single geometry modification tool is active, the method includes receiving a subsequent second selected single CAD object from the user, and further; entering a merged state when the subsequent second selection from the user is selected in a manner indicating a merger operation, and automatically merging the first selected single CAD object and the second selected single CAD object into a single merged CAD object; and entering a cut state when the subsequent second selection from the user is selected in a manner indicating a cut operation, and automatically cutting the first selected single CAD object with the second selected single CAD object, wherein the first selected single CAD object is cut into at least two distinct CAD objects. The merged or cut CAD objects are then displayed within the graphical user interface of the computer aided design modeling system.

In some embodiments of the invention, an automatically generated merged CAD object is generated with the attributes of the first selected single CAD object. In other embodiments of the invention, at least one of the at least two distinct CAD objects is deleted in response to a further received selection from the user. In yet other embodiments of the invention, upon receiving a selection of a third single CAD object from the user, the at least two distinct CAD objects are cut by the selected third single CAD object.

Another embodiment of the invention is a method of cutting geometry-only format CAD objects stored within a computer aided design modeling system and without related history information, using a single geometry modification tool and interface. The method includes displaying a plurality of CAD objects and a plurality of geometry modification tools, including the single geometry modification tool, within a graphical user interface of the computer aided design modeling system. The method also includes receiving an activation through a graphical user interface, from a user of the computer aided design modeling system, of the single splitting too. Once activated, the tool receives a selection, from the user, of a face of a solid CAD object, while the splitting tool is active, and automatically merges, the at least one face of a solid object, into a cutting object, based on the received selection from the user. The method also includes extending the edges of the cutting object to create a cutting plane, inferring the solid CAD object based on the received selection of the face of the solid CAD object, and automatically cutting the solid CAD object into at least two distinct CAD objects using the extended cutting plane. The cut CAD object is then displayed within the graphical user interface for the user.

DETAILED DESCRIPTION

Embodiments of the invention allow any solid object or surface to be combined or split by another solid or surface in a simple and intuitive manner. Solids and surfaces can be modified regardless if they were originally created in the embodiment's CAD system or if they were imported from another CAD system.

In one embodiment, the invention is a set of two tools within a three-dimensional modeling system, namely a Combine tool and a Split Body tool. The Combine tool can be used to combine or split solids or surfaces by any other solids and surfaces. The Split Body tool can be used to split a solid by one of its own faces. These modifications can be made without the need to completely rebuild the object or deal with various constraints of the modeled object. The term "objects" refers to any geometric solid or surface represented within the CAD system. Solid objects can be composed of a set of faces that enclose a volume.

When combining objects within the CAD system, the Combine tool takes user-selected solids or surfaces as inputs and delivers a single, combined solid or surface as an output. When splitting objects, the Combine tool takes a first user-selected object as the "target" object and cuts it with a second user-selected object as the "cutter" object. The combine tool delivers multiple objects as outputs. The combine tool also lets a user easily merge objects by inferring a merge operation if the user selected multiple objects, either by selecting a group of objects all at once, or by selecting a first object and then additional objects individually.

When splitting a solid with one of its own faces, the Split Body tool takes a first user-selected face as an input, infers the target solid from the selected face, and cuts the target solid with a cutting surface based on the selected face. The Split Body tool delivers multiple objects as outputs. When splitting a face by another face, the Split Face tool takes a user-selected target face and cutter face and delivers multiple faces as an output. The objects output by all these tools can be edited like any other solid or surface geometry.

Figure 4:
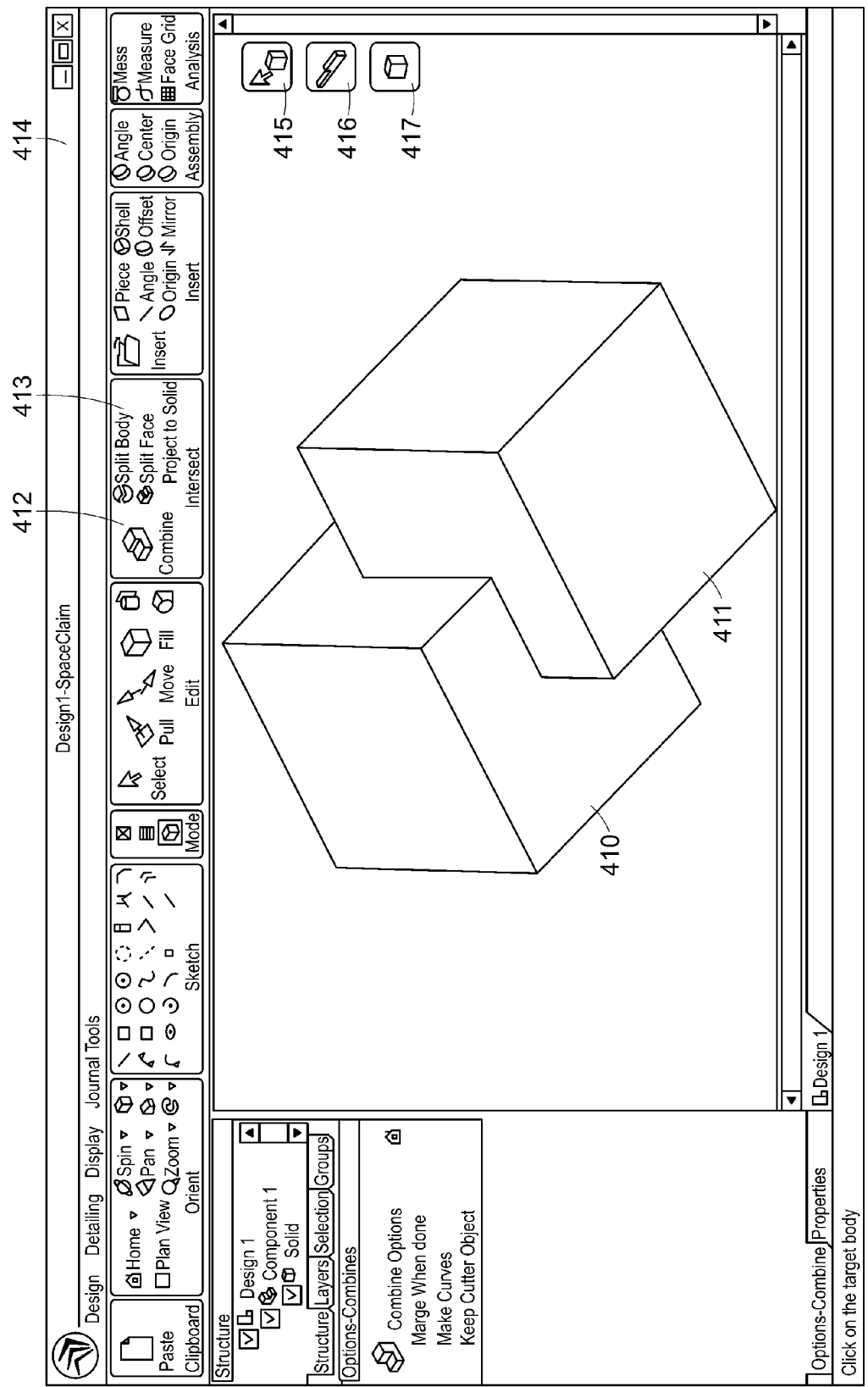
FIG. 4 shows a three-dimensional modeling software application containing the combine tool and displaying two solids that can be merged by the tool.

The simple and intuitive method of combining and splitting objects is possible because the modeling system used with the combine tools does not maintain a level of history information on top of the geometry information and can therefore show geometry changes immediately. The moment a user selects the objects to be combined or split, the program regenerates the object. The simplicity of this method is shown by FIG. 4, which shows a first and second solid object that can be merged together, or where the first solid object can be cut by the second. The user can use the combine tool 412, along with the select target sub tool 415 to merge the objects, or alternatively, the select cutter subtool 416 to cut the first object. These processes are all done using the single combine tool, along with the proper selections of objects using the sub-tools, or an alternative method (e.g., keyboard combined with mouse clicks).

Figure 1:
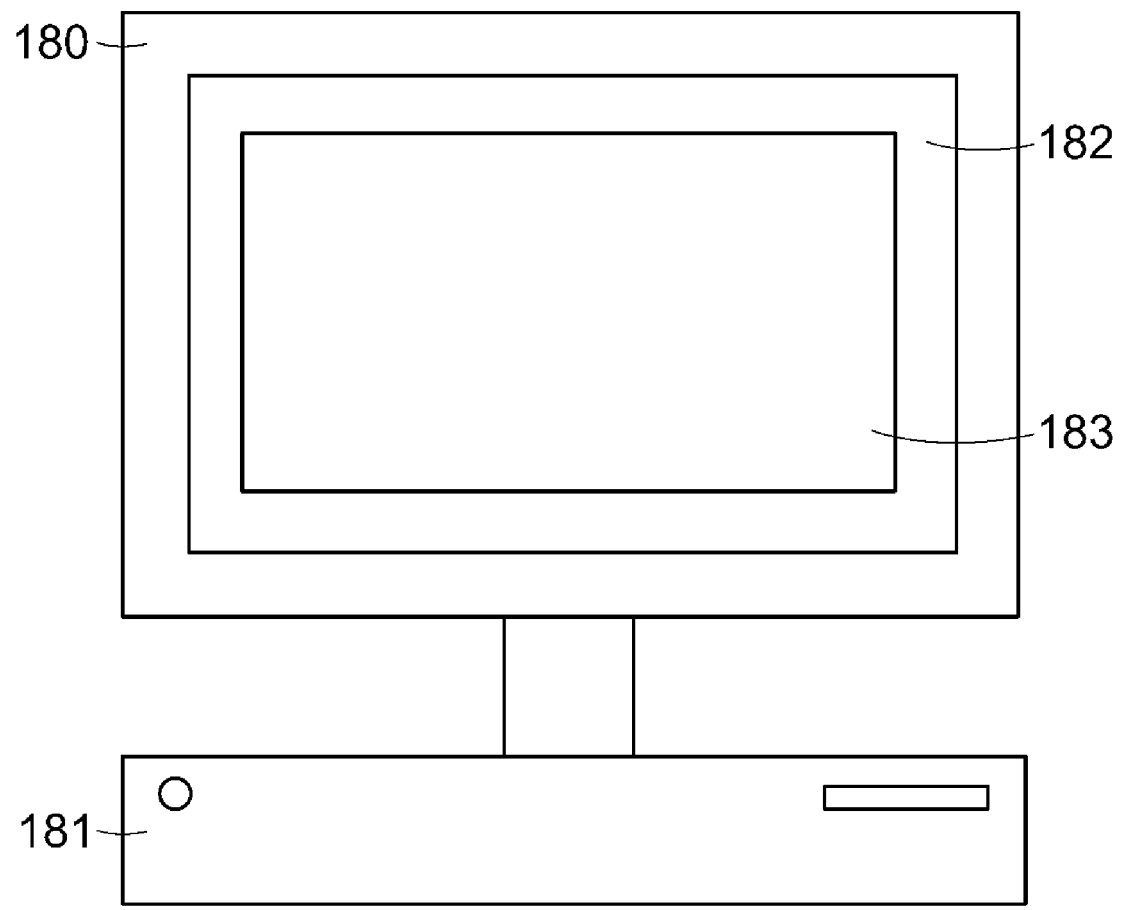
FIG. 1 shows a computer system on which the combine tools in accordance with embodiments of the invention can be implemented.

FIG. 1 shows a computer system capable of implementing embodiments of the invention. Further details of the overall system are given in related application entitled "Method for Modifying Any Modeled Surface As A Lofted Surface," filed Nov. 9, 2007, and with Ser. No. 11/937,926, which is herein incorporated by reference in its entirety.

The system includes a computer 181 containing memory and a processor running a standard operating system 182. Running within the operating system 182 with a graphical user interface, is a user-level application 183, such as a modeling system that includes combine tools in accordance with embodiments of the invention. The operating system and the modeling system are displayed on the monitor 180.

Computer 181 can also have a network interface card and be connected to other computers, servers, and/or storage service. To interface with modeling system 183 a mouse and keyboard (not shown) or other input device can be used. In detail, one example of a computer system capable of running the combine tools is a computer system running Microsoft Windows XP with Service Pack 2 or Windows Vista operating systems. The computer system has a video card, such as those provided by Radeon, NVIDIA, or AMD, with Full DirectX 9c hardware support and 64 MB or more of graphics memory, Pixel shader 2.0 hardware support, 32 bits/pixel, and 1024× 768 minimum resolution. The computer system can have a Pentium 4 2.0 GHz or Athlon 2000+ or faster processor, a 32-bit (x86) or 64-bit (x64) processor. The computer system can have between 512 MB and 4 GB of RAM. The system can also have 2 GB of available disk space, a CD/DVD drive, Microsoft Internet Explorer 5.5 or higher, and a 2 button+ wheel mouse.

Figure 2:
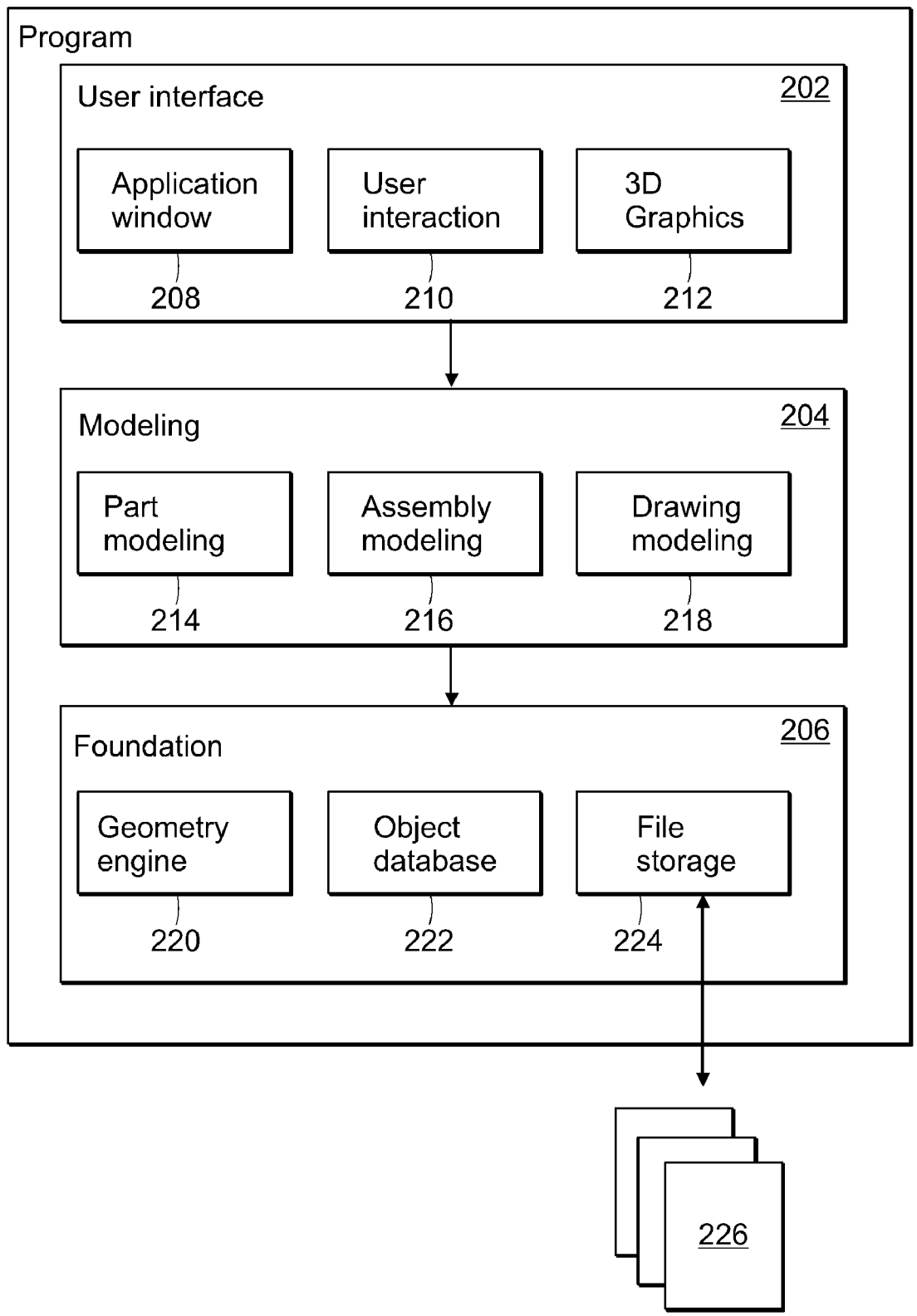
FIG. 2 shows the overall architecture of the modeling system and combine tools.

FIG. 2 is an overall architecture diagram of the structure of the combine tools within the modeling system in accordance with embodiments of the invention.

The modeling system 183 is made up of a user interface layer 202, a modeling layer 204, and a foundation layer 206. The user interface layer interacts with the user, the modeling layer embodies logic associated with the combine tools and other tools of the modeling system, and the foundation layer provides geometry modeling and other file services.

The user interface layer 202 is made of an application window 208, which contains the combine tool widgets, and other interface components common to modeling tools that allow a user to interact with the modeling system. It also contains the standard window manipulation features.

User interaction component 210 includes the combine tool widgets, and other standard tools for selecting objects, viewing objects in different ways, or obtaining information about objects. Essentially, the user interface layer provides a way for the user to work with the geometry model and the geometry engine, the output of which is displayed on the monitor 180 using a 3D graphics engine 212. 3D graphics engine 212 renders geometry models to the application window 208 for interaction and manipulation by the user. This functionality can be provided by DirectX.

The modeling layer 204 provides the logic and algorithms that underlie the commands and tools in the user interface. It communicates with the geometry engine 220 based on user actions to display the geometry created by the user actions. The geometry engine is a known component capable of performing calculations on objects. One geometry engine compatible with embodiments of the invention is the ACIS geometry engine from Spatial Corporation, although other geometry engines with similar capabilities may also be used. Further details of the ACIS geometry engine are provided in Corney, J and Lim, T, 3D Modeling with ACIS, Stirling, UK, which is hereby incorporated by reference in its entirety.

The modeling layer is made up of part modeling component 214, assembly modeling component 216, and drawing modeling component 218. The part modeling component 214 manages CAD objects and houses creation and manipulation algorithms in the area of 3D solids and 2D sections and sketches.

The assembly modeling component 216 manages CAD objects and algorithms for assembly component instantiation and placement, mating conditions, and the ability to do part modeling in the context of an assembly. Assemblies are user-created collections of parts. The assembly modeling component is responsible for combining and splitting objects in accordance with the operation of the combine tools. These objects may be contained within a single part, but may also be contained within or across assemblies.

The drawing modeling component 218 manages CAD objects and algorithms for creating multi-sheet drawings, drawing views, and drawing annotations. Drawings are 2D representations of 3D objects meant to be printed on paper in standard engineering sizes and formats.

The foundation layer 206 provides a software platform used to support higher-level layers of the application. The geometry engine 220 supports the creation and modification of geometry and topology, and provides algorithms for solid modeling and geometric solving. The object database component 222 manages the temporary, in-memory representation of CAD objects, providing a unified framework for inter-object references, undo actions, and associative updates. The file storage component 224 provides persistent storage of CAD objects within document files 226, along with inter-document relationships, such as assembly-component relationships or drawing-format relationships.

Figure 3:
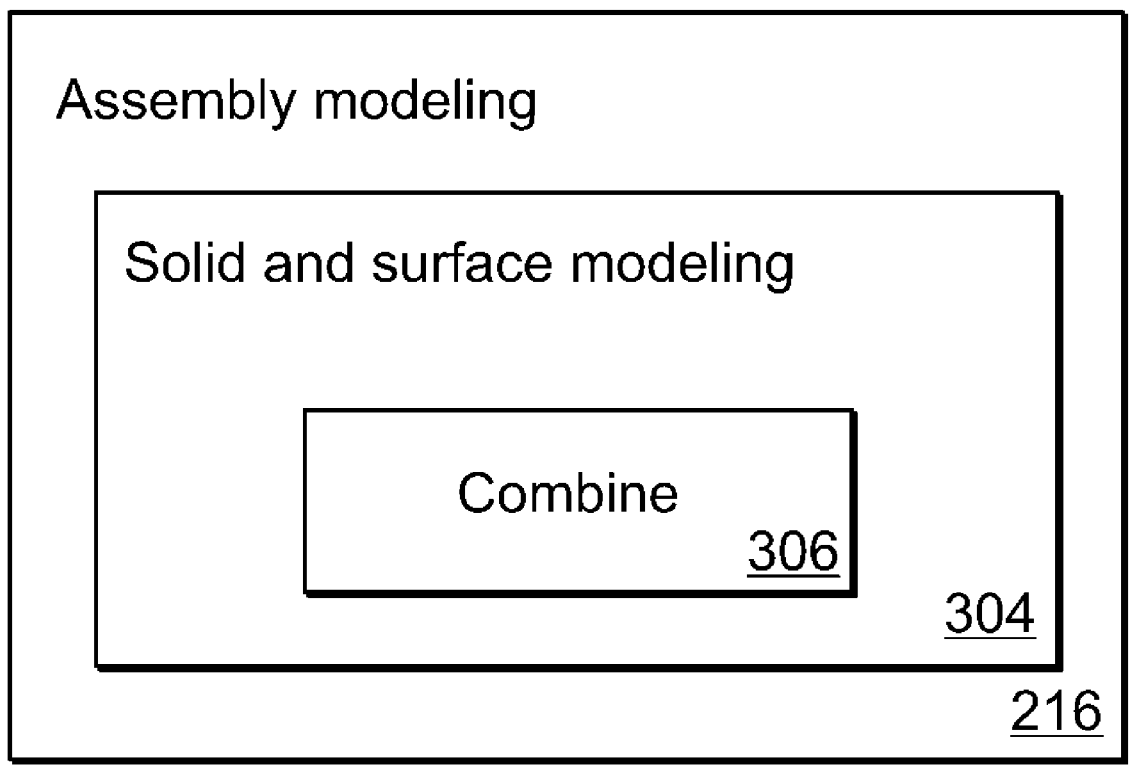
FIG. 3 shows the detailed architecture of the components that contain the combine tools.

FIG. 3 shows the hierarchy of object modeling components in accordance with the design of the combine tools.

In the CAD program, multiple solids and surfaces are modeled in the assembly modeling component 216 which has the necessary algorithms for management and manipulation of multiple, intersecting objects.

Within the assembly modeling component is the solid and surface modeling component 304 which is responsible for the management and manipulation of multiple solid objects and surfaces. Unlike parametric, feature-based CAD systems, which make up the majority of the current systems, embodiments of the invention works directly in real time on the solid and surface geometry, as opposed to forcing the user to set up each individual object in a particular feature and then requiring a calculation at the end of the operation. Finally, the combine component 306 is a subset of the solid and surface modeling component and contains the algorithms, including embodiments of the invention, for combining and splitting multiple solids and surfaces.

Figure 5:
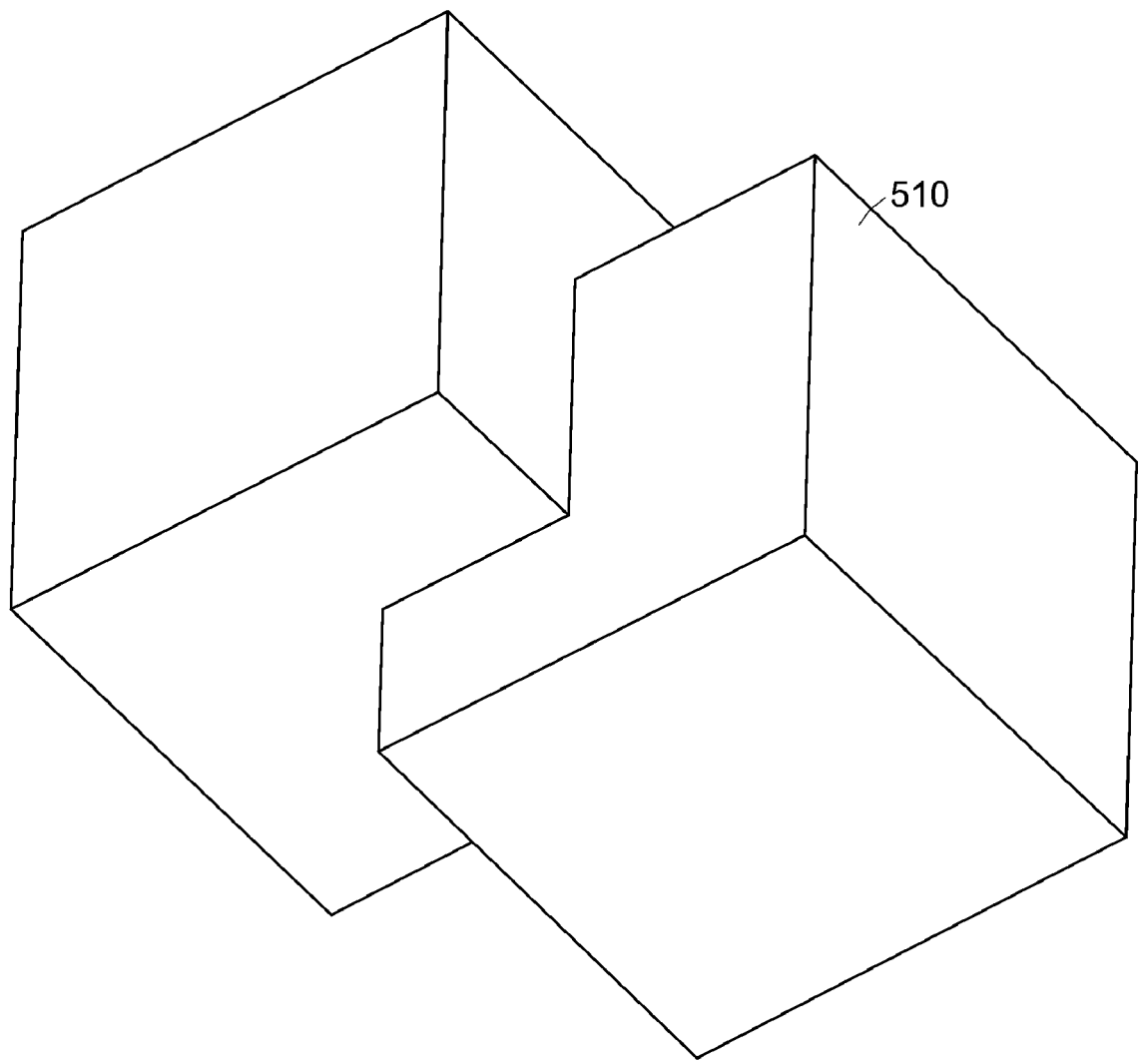
FIG. 5 shows a merged solid created by merging the solids in FIG. 4 using the combine tool.
Figure 6:
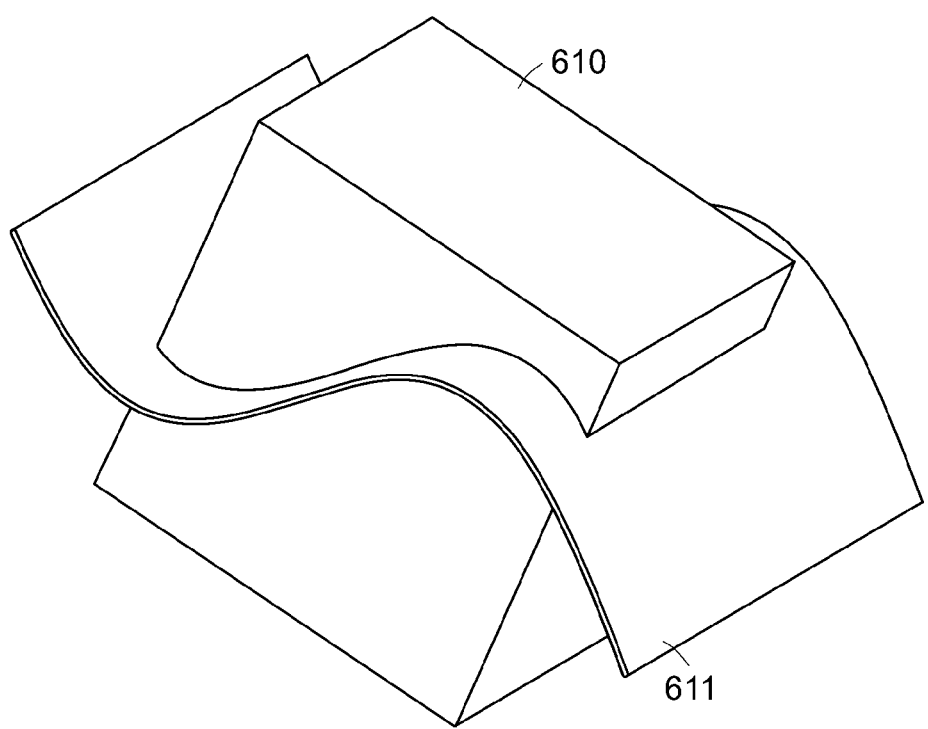
FIG. 6 shows a solid that can be split by an intersecting surface using the combine tool.
Figure 7:
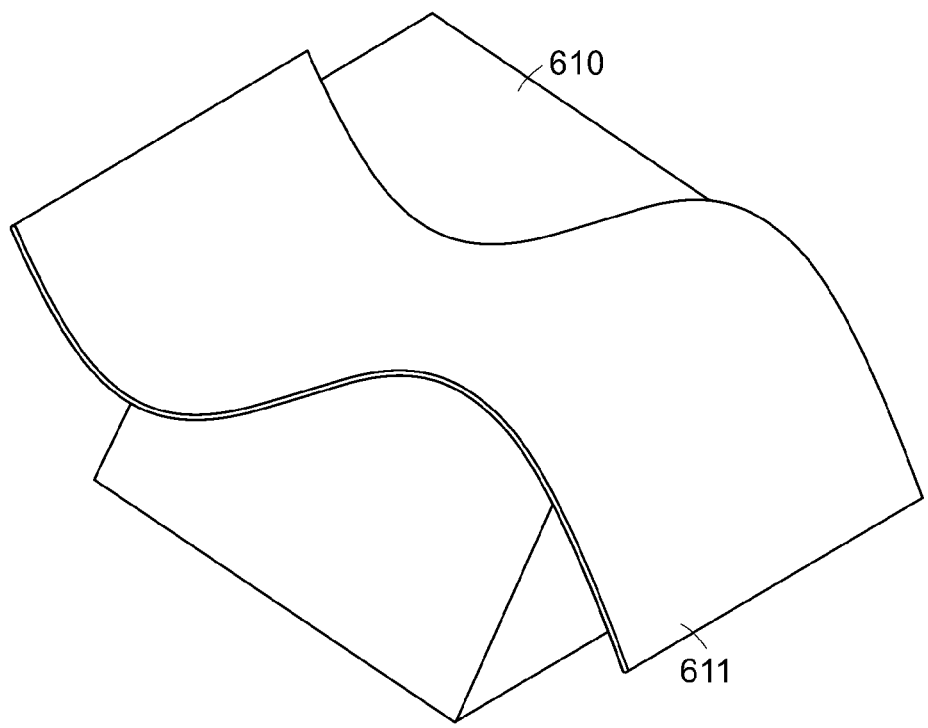
FIG. 7 shows the state of the interface as the user selects the Cutter surface from FIG. 6 using the Select Cutter sub-tool.
Figure 8:
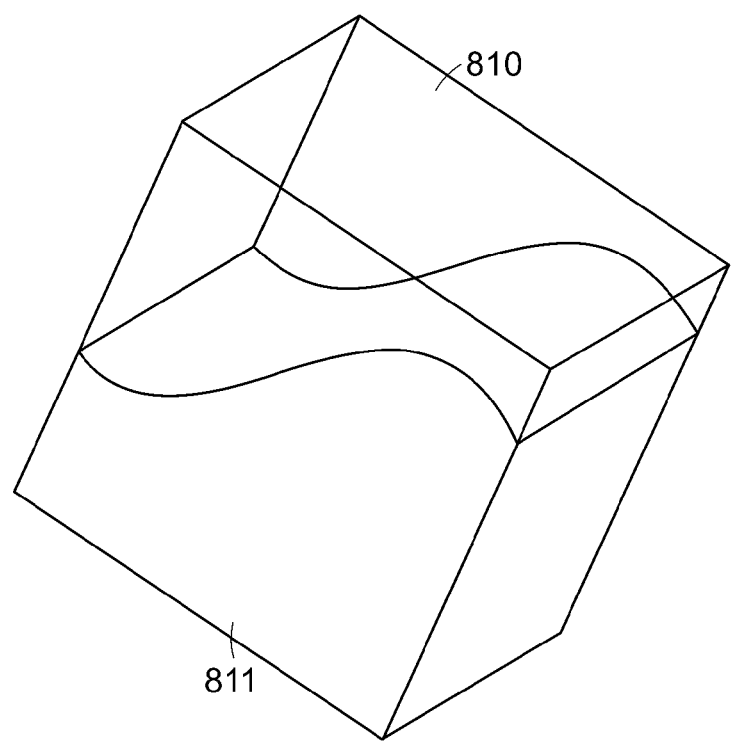
FIG. 8 shows the two solids created by splitting the solid in FIG. 6 using the tool.
Figure 9:
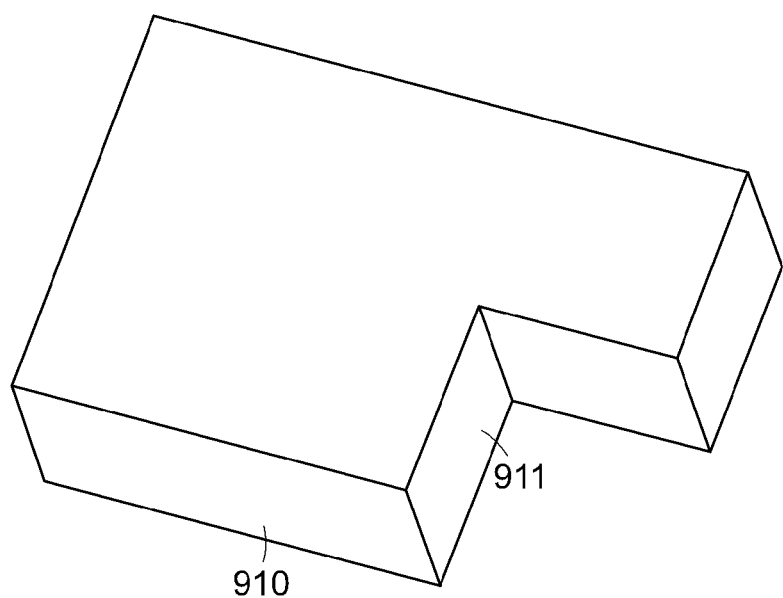
FIG. 9 shows a single solid object that can be split by its faces using the Split Body combine tool.
Figure 10:
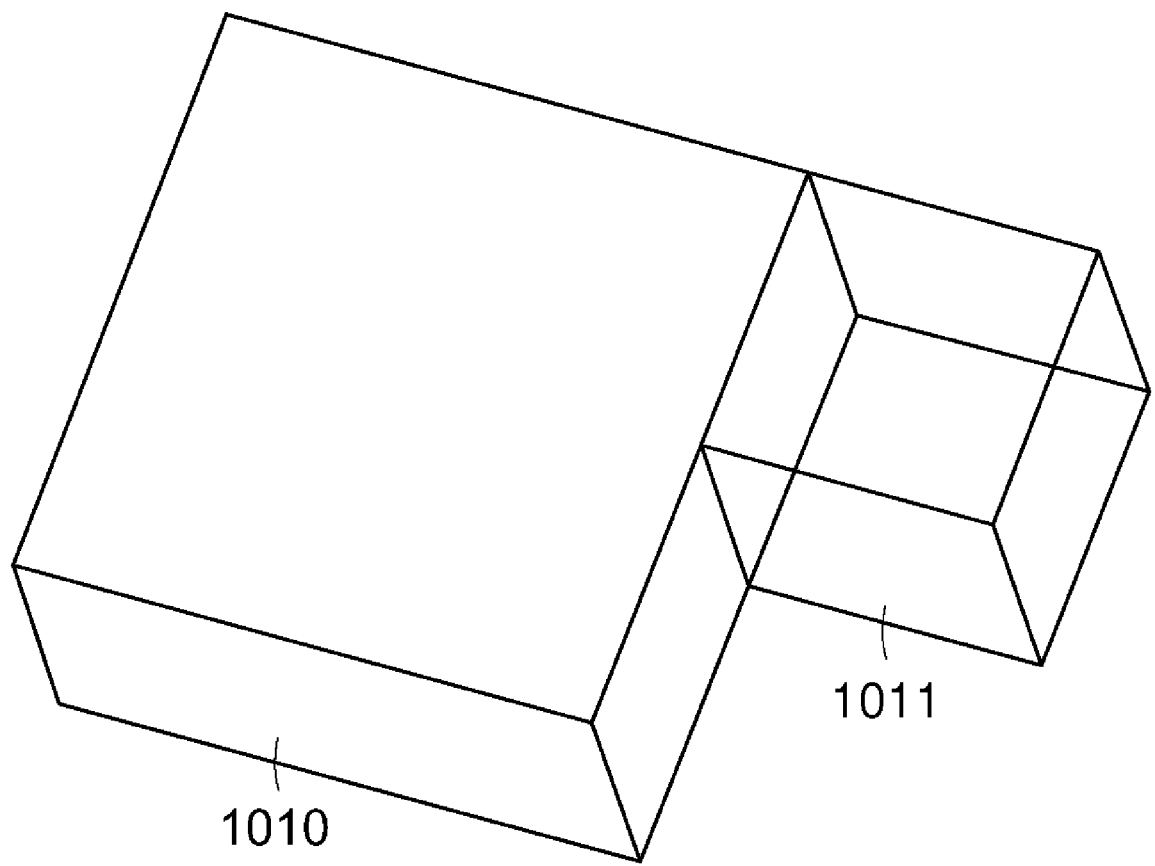
FIG. 10 shows the two solids created by splitting the solid in FIG. 9 using the Split Body combine tool.
Figure 11:
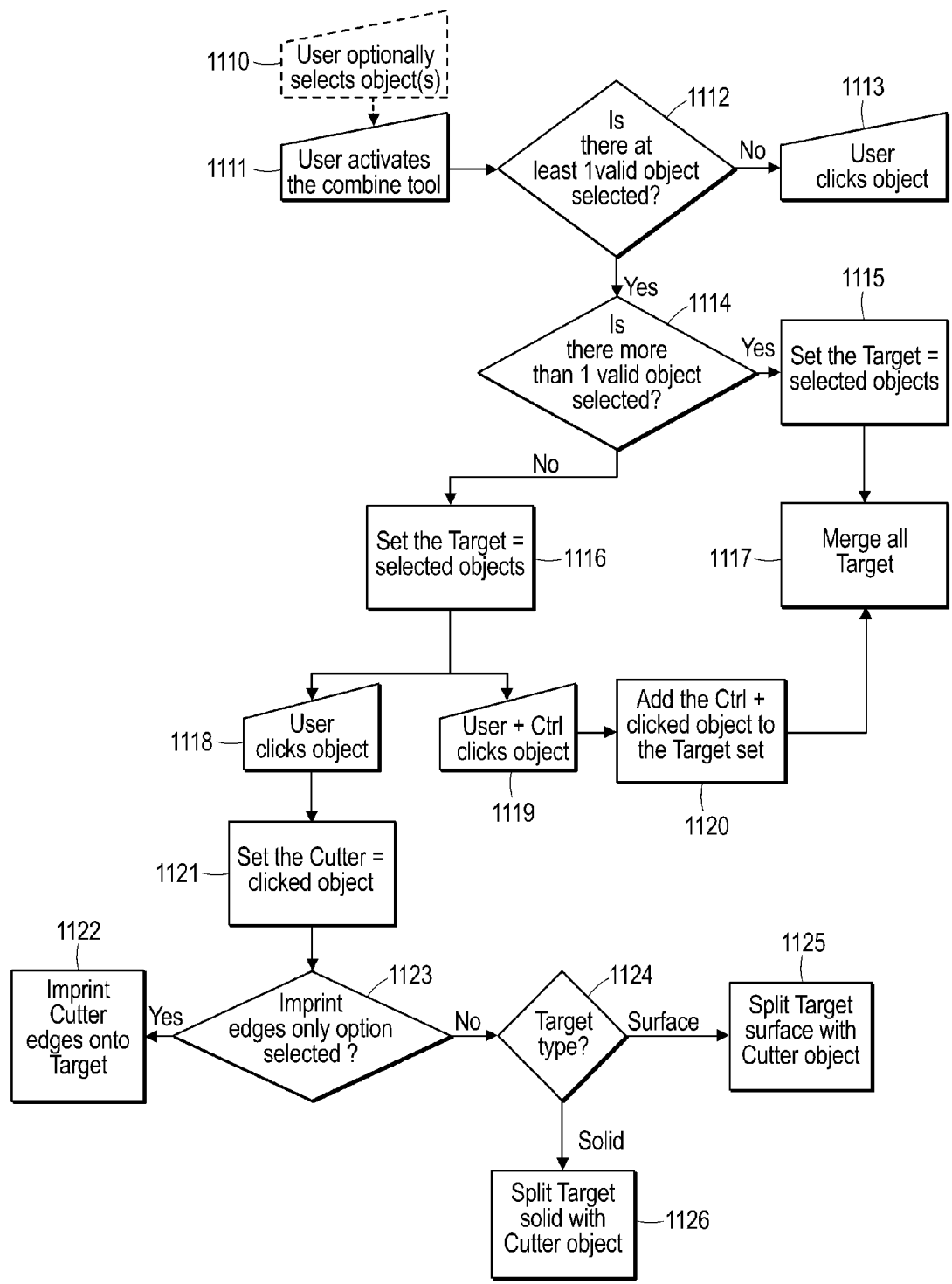
FIG. 11 describes an overview of the back-end logic for implementation of the combine tool.

Operation of the combine tools by a user will now be described with respect to FIGS. 4-11. FIGS. 4 and 5 show two solids being merged, FIGS. 6-8 show a solid being split by a surface, and FIGS. 9-11 show a solid being split by one of its own faces.

FIG. 4 shows two solids 410 and 411 that can be merged by the combine tools in accordance with embodiments of the invention.

The combine tools can be accessed through many methods, including the use of toolbar buttons 412 and 413 within the application window 414 of the overall CAD system. The combine sub-tools 415-417 are also shown. The Select Target sub-tool 415 is used to select the object(s) to be merged or the target object to be split. The Select Cutter sub-tool 416 is used to select the object that will cut the target object. The Select Regions sub-tool 417 is used to select any regions that result from a split for optional deletion. Alternatively, keyboard combinations with the mouse or the keyboard alone could be used instead of sub-tools 415-417.

FIG. 5 shows the single solid 510 created when the two solids 410 and 411 are selected, then merged using the combine tool 412.

FIG. 6 shows a solid 610 that can be split by the intersecting surface 611. In FIG. 6, the user is selecting the solid target using the combine tool's Select Target sub-tool 415.

FIG. 7 shows the user selecting the surface 611 to be used as the cutter for the target solid 610. In FIG. 7, the user is selecting the cutter surface using the combine tool's Select Cutter sub-tool 416.

FIG. 8 shows the two solids 810 and 811 that result from splitting the target solid with the cutter surface using the combine tool 412. Solid 810 is highlighted in red by the combine tool's Select Regions sub-tool 417 for optional deletion.

FIG. 9 shows a single solid 910 that can be split by its faces using the Split Body combine tool 413.

Combine tool 413, called the Split Body tool, provides a shorter user interaction than combine tool 412. It eliminates the selection of the target solid by inferring the target solid by the face selected as the cutter. In FIG. 9, the user is selecting a face 911 to split with using the combine tool's Select Cutter sub-tool 416.

FIG. 10 shows the two solids 1010 and 1011 that result from splitting the target solid with the cutter face using the combine tool 413.

Solid 1011 is highlighted in red by the combine tool's Select Regions sub-tool 417 for optional deletion.

Regardless of whether the combine tool is being used to merge or split solids and surfaces with a newly created object, an existing object, or an object from another CAD system; the modeling system uses the foundation layer's geometry engine 220 to convert the imported data from the originating application into a geometry-only format.

This comprises stripping all history and feature data, so that the source of the geometry data has no influence. The geometry engine also performs all conversion, checking, and geometry calculation functions. On import, the CAD system retrieves only the final definition of the geometry, and places it into the object database 222. The CAD system creates a new, persistent file with the file storage component 224. If the geometry was imported from another system, the history and parameters used to create the final geometry in that software are ignored.

Importing and translation of outside geometry can be performed by the geometry engine through its built in translators. After importing outside geometry, the geometry-only data is provided to higher-level layers of the system. Although history information and other data from parametric systems has been removed, the geometry still retains information about primitives and relations between objects in the imported geometry.

Figure 12:
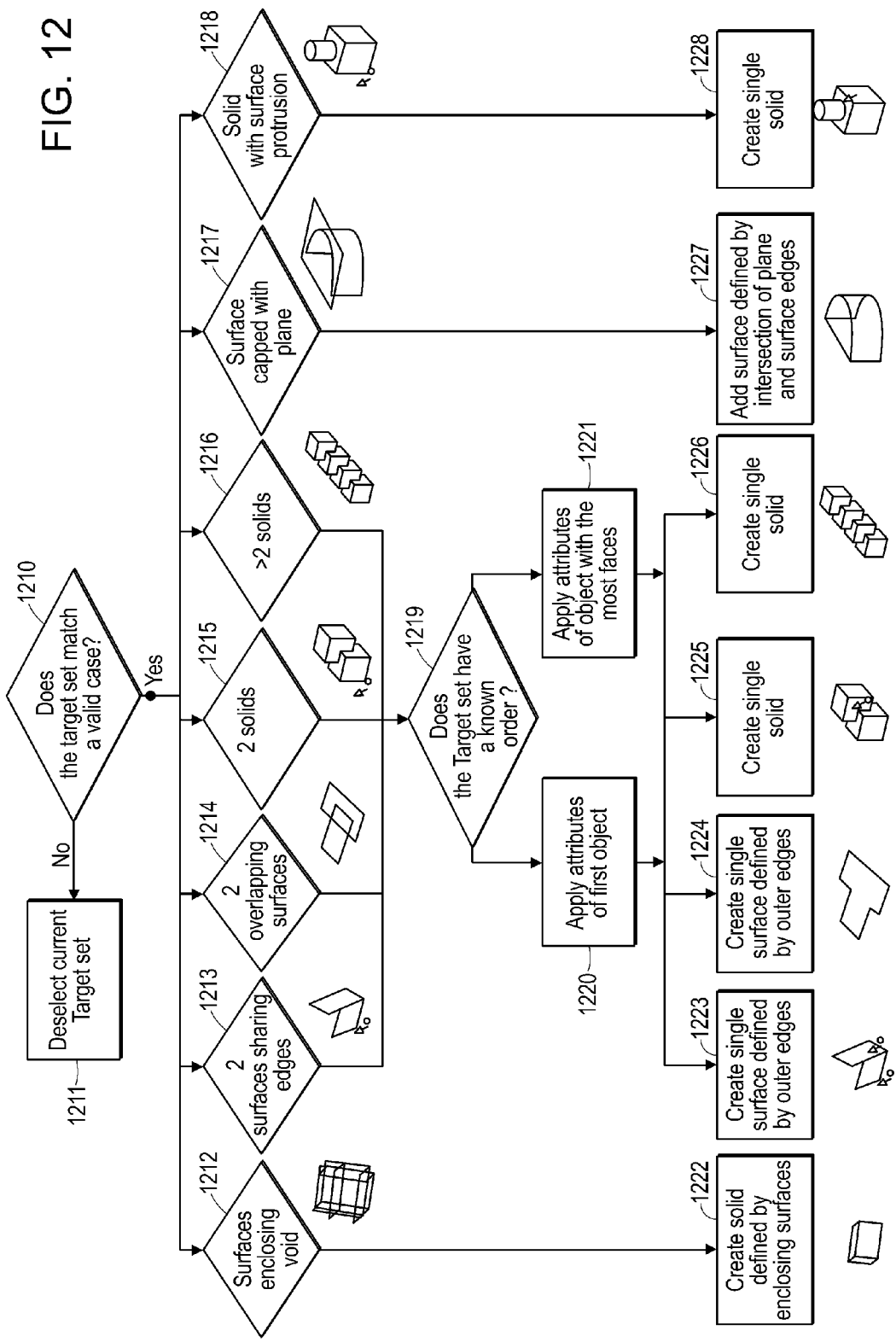
FIG. 12 describes detailed back-end logic for implementation of the merge function of the combine tool.
Figure 13:
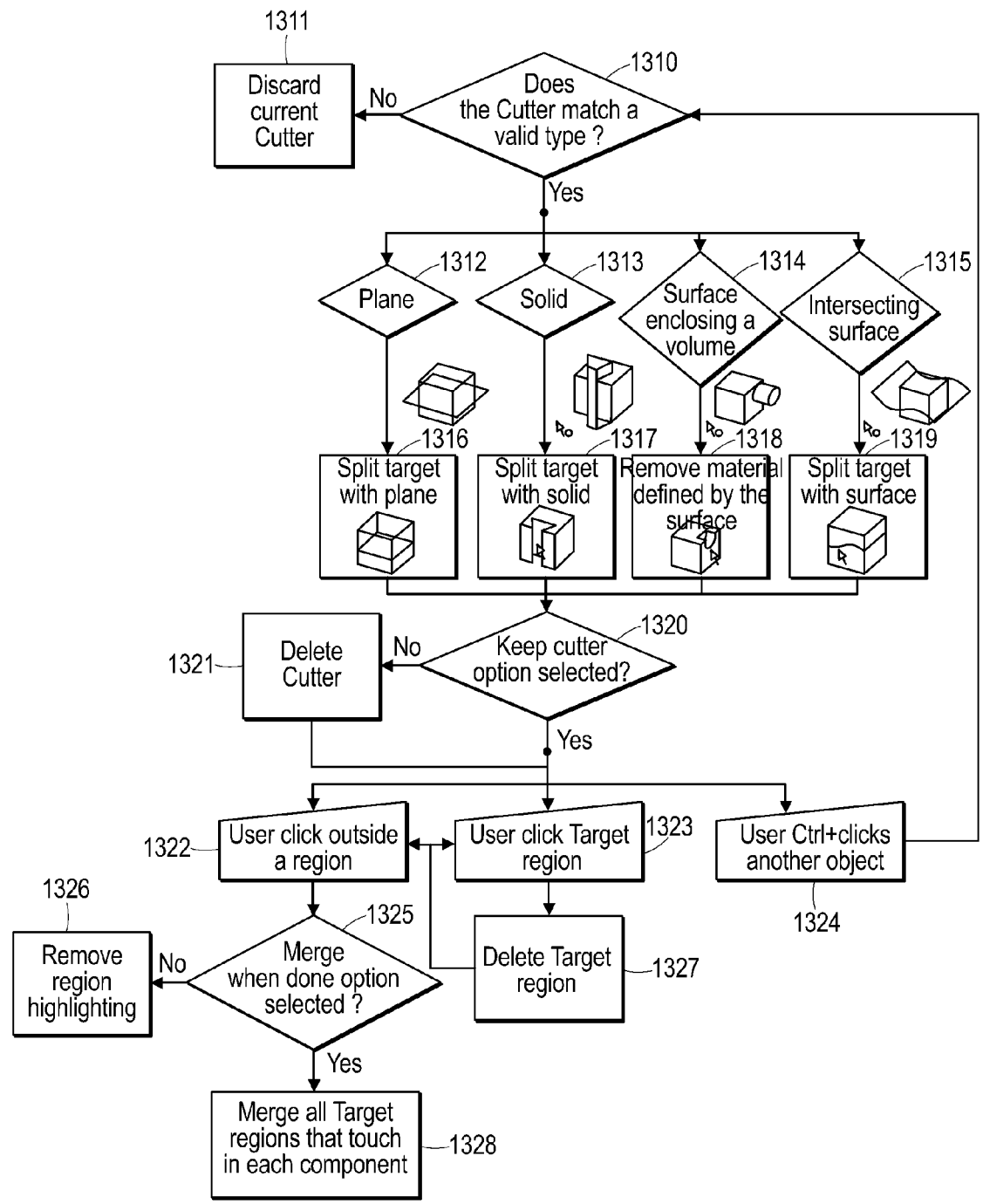
FIG. 13 describes detailed back-end logic for implementation of the split function of the combine tool when used on a solid target.
Figure 14:
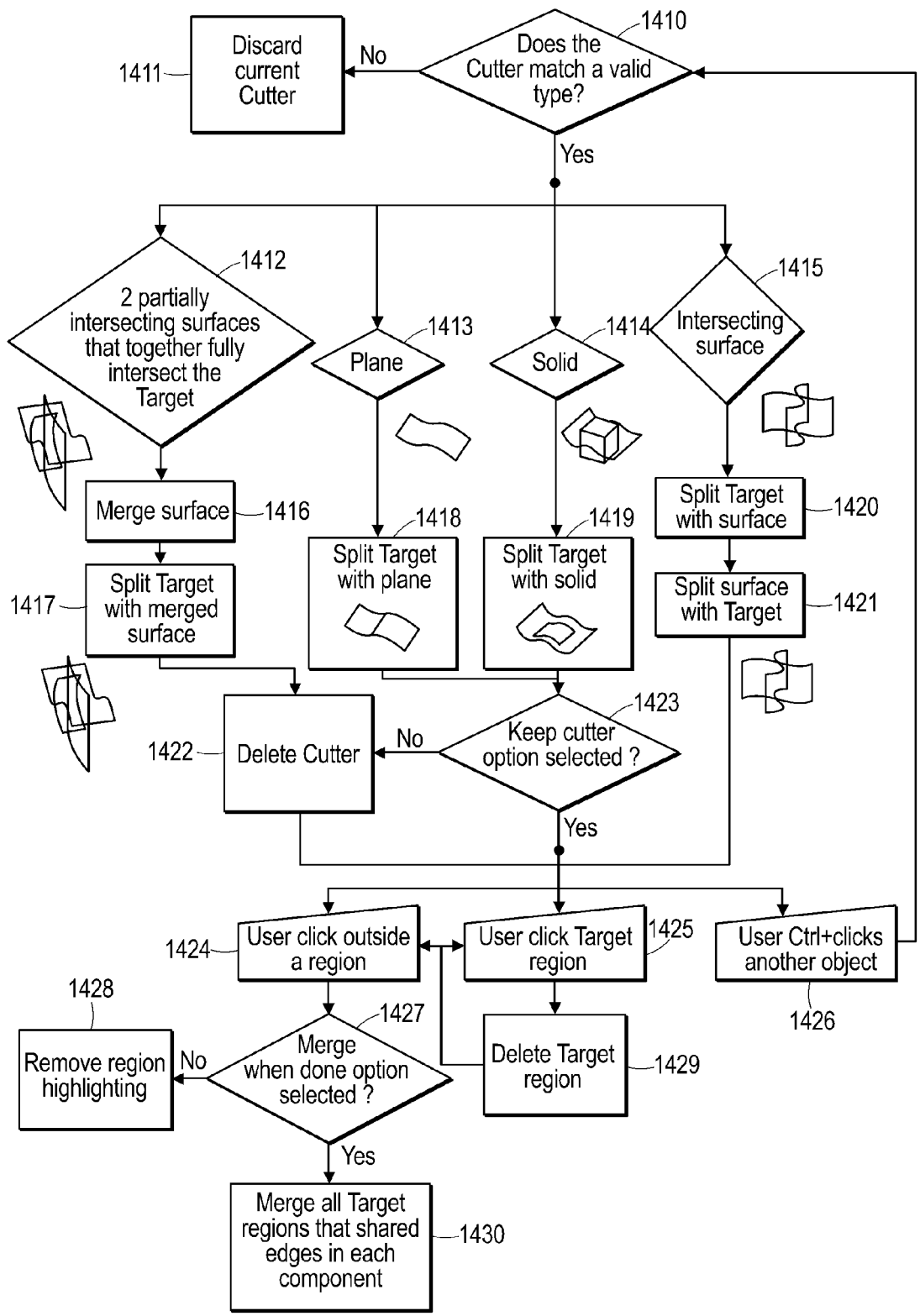
FIG. 14 describes detailed back-end logic for implementation of the split function of the combine tool when used on a surface target.
Figure 15:
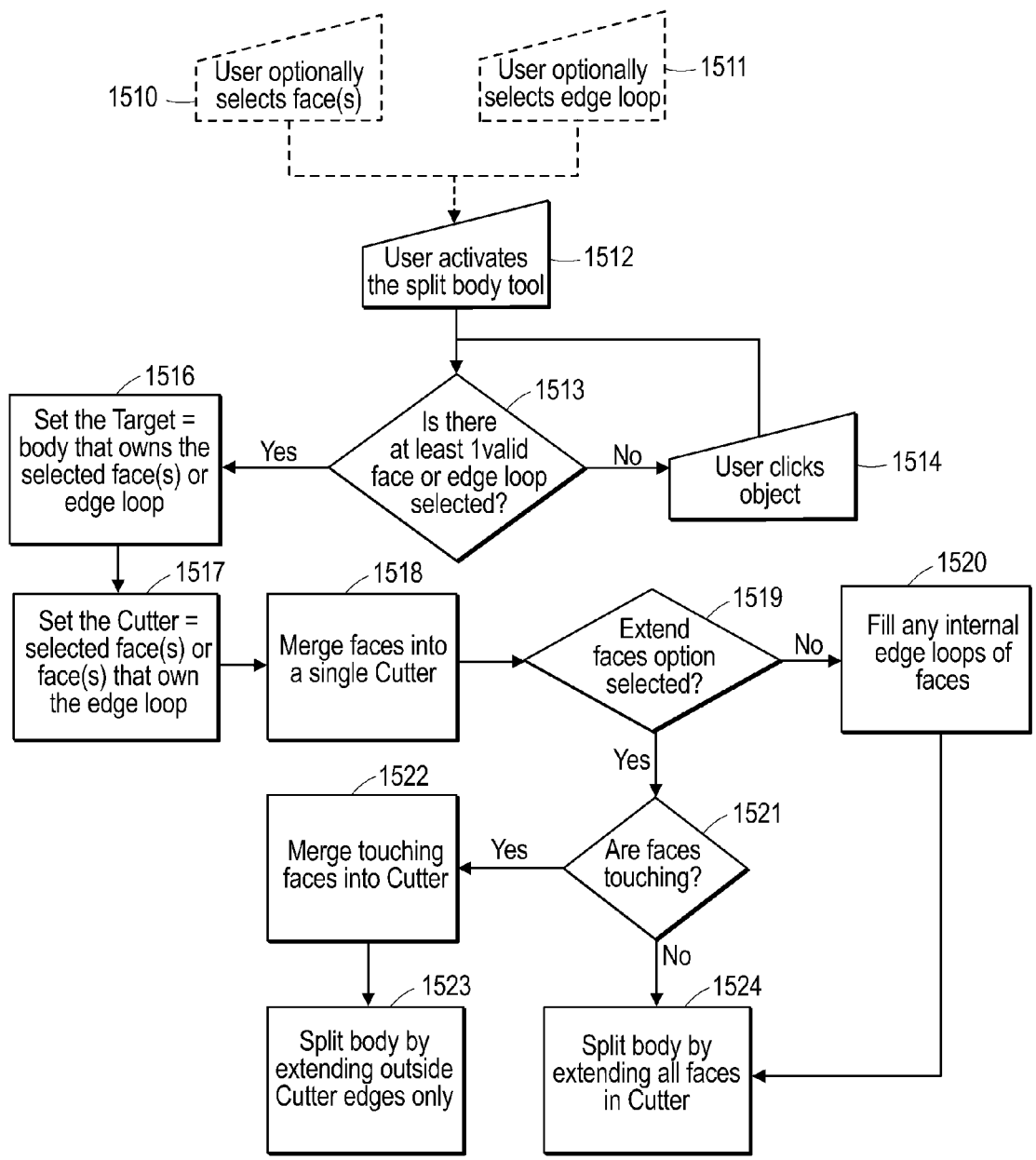
FIG. 15 describes detailed back-end logic for implementation of the Split Body combine tool.
Figure 16:
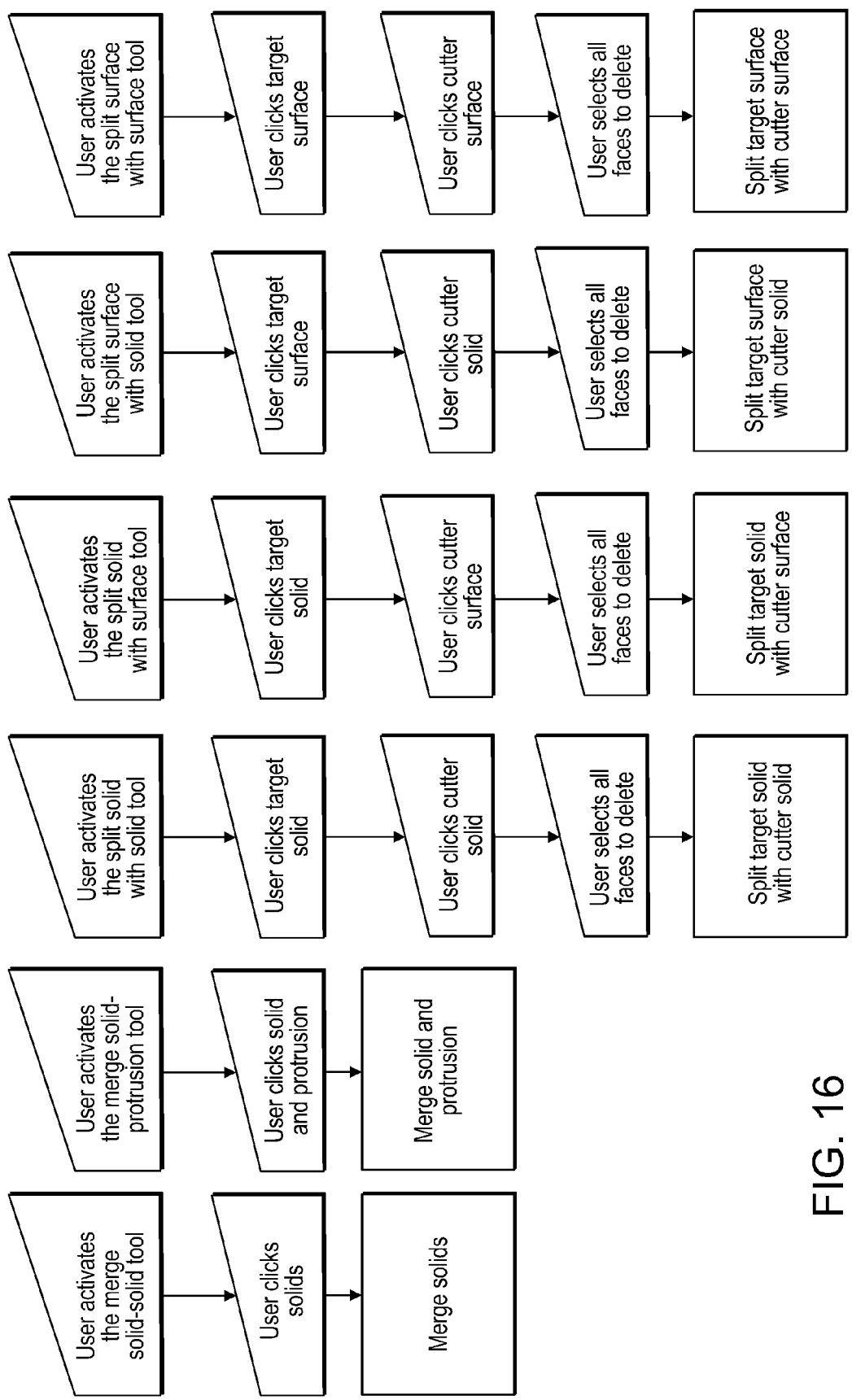
FIG. 16 describes the logic used by other systems to implement the combine functions.

The logic of the combine tools will now be described with respect to FIGS. 11-15. FIG. 11 shows an overview of the logic that implements the merging and splitting of intersecting solids and surfaces. FIGS. 12-14 show the detailed logic that implements the merging and splitting of intersecting solids and surfaces. FIG. 15 shows the logic for splitting a solid by its own faces.

FIG. 11 shows how a user can merge or split objects using only a few mouse clicks and the single Combine tool. If multiple objects are selected, the system can infer that a merge operation is to be performed. Otherwise a user can still perform a merge by using the select target tool and selecting an additional object. When cutting an object, a user selects a first solid or surface, then selects a second solid or surface to cut it with. Both these operations can be done with the same tool, instead of having multiple tools and multiple workflows. Further, no history information is maintained about the change, and a merged object can be easily and immediately be merged with other objects, or split in various ways.

At step 1110, the users may have selected an object or objects that they want to be the target of a split or merge operation. At step 1111, the user activates the combine tool, and the tool activates the Select Target sub-tool.

At step 1112, the combine tool checks to see if any objects are selected. If objects are selected, then the minimum set of requirements for the first sub-tool is met, and the tool checks that they are valid objects for a merge or split operation. If there are no objects selected or if the selected objects are not valid, the tool waits for the user to click another object, as shown in step 1113.

At step 1114, the combine tool checks to see if multiple valid objects are selected. If they are, since the tool cannot differentiate between the user intention on multiple selection (that is, which object is intended to cut which other object), it assumes that the user wants to merge, and the tool sets the selected objects as the Target set (step 1116) and merges them at steps 1115 and 1117. The logic comprising step 1117 is further detailed in FIG. 12.

If, at step 1114, the combine tool determined that there is only one valid object, then it sets that object as the Target, highlights the target, activates the Select Cutter sub-tool, and waits for the next user action. If the user Ctrl+clicks another object (step 1119), the tool adds that object to the Target set and merges the set in steps 1120 and 1117. If the user clicks another object (step 1118), the tool sets the clicked object to be the Cutter at step 1121.

At step 1123, the tool checks to see if the user activated the Imprint edges only option. If this option is selected, the tool imprints the edges of the Cutter onto the Target (step 1122), but does not split the Target. If this option is not selected, the tool determines whether the Target is a surface or solid at step 1124. If the Target is a surface, the tool splits the Target surface with the Cutter at step 1125. If the Target is a solid, the tool splits the Target solid with the Cutter at step 1126. The logic comprising steps 1125 and 1126 is further detailed in FIGS. 13 and 14.

FIG. 12 shows the detailed logic that merges intersecting solids and surfaces. At step 1210, the combine tool checks that the Target set matches one of the cases shown in steps 1212-1218. If the Target set does not match one of those cases, the set is discarded (step 1211) and the tool returns to step 1112, shown in FIG. 11.

At steps 1212-1218, the combine tool determines which case the Target set represents. At step 1212, the combine tool determines if the target set is a set of surfaces enclosing a volume. At step 1213, the combine tool determines if the target set is two surfaces that share an edge. At step 1214, the combine tool determines if the target set is two overlapping surfaces. At step 1215, the combine tool determines if the target set is two solids. At step 1216, the combine tool determines if the target set is more than two solids. At step 1217, the combine tool determines if the target set is a solid object capped by a plane. At step 1218, the combine tool determines if the target set if a solid with a surface protrusion.

If the target set is determined to meet one of the cases in steps 1213-1216, then at step 1219, the Target set is analyzed to determine the order in which the objects were selected. If the order is known (that is, if the user clicked and Ctrl+clicked to form the Target set), then the attributes of the first object are saved to apply to the merged object (step 1220). If the order is unknown (that is, if the user box-selected to create the Target set), then at step 1221 the attributes (name, color, layer membership) of the object with the most faces is used. These attributes are used to create the merged object as described below with respect to steps 1222-1228. At the end of the merge, the merged object is highlighted, and the combine tool returns to step 1116, as shown in FIG. 11.

At step 1222, a set of surfaces that completely encloses a void is merged to form a solid defined by the enclosing surfaces. To do this, the tool calls the geometry engine's (220) split function, passing it all the surfaces in the set without checking the validity of the resultant body. The split function splits all the surfaces in the set by each other and returns a temporarily invalid body. Next, the tool asks the geometry engine to find all manifold (i.e., closed) pieces, or those that have a defined inside and outside. Next, the tools asks the geometry engine to find and remove all laminar (i.e., open) pieces. Next, the tool asks the geometry engine to find and remove all faces common to closed bodies, which returns one closed body with extra edges. Finally, the tool calls the geometry engine's merge function, checking the validity of the resultant body to remove redundant edges. The geometry engine returns one closed solid body. The original surfaces are then deleted unless the Keep Cutter option is selected.

At step 1223, two surfaces that share edges are merged into a single surface defined by the outer edges of both surfaces. To do this, the tool calls the geometry engine's stitch function along common edges to make one valid surface.

At step 1224, two overlapping planar surfaces are merged into a single surface defined by the outer edges of both surfaces. To do this, the tool calls the geometry engine's union function to discard inner edges and merge the outside edges into one loop.

At step 1225, two intersecting solids are merged into a single solid. To do this, the tool calls the geometry engine's split function without the body checking parameter. Then it asks the geometry engine to find and remove all faces common to closed bodies. The geometry engine returns one closed body with extra edges. Next the tool calls the geometry engine's merge function with the body checking parameter to remove edges. The geometry engine returns one closed solid body.

At step 1226, three or more solids are merged into a single solid. To do this, the tool calls the geometry engine's split function without the body checking parameter. Then it asks the geometry engine to find and remove all faces common to closed bodies. The geometry engine returns one closed body with extra edges. Next the tool calls the geometry engine's merge function with the body checking parameter to remove edges. The geometry engine returns one closed solid body.

At step 1227, a surface capped by a plane is merged into a single surface that includes the surface defined by the intersection of the plane and the edges of the surface. To do this, the tool asks the geometry engine to substitute a very large planar surface for the plane object. Then it asks it to find the partial intersection (the edge of the surface in the plane makes planar curves) and find the open curves. Next, the tool asks the geometry engine to connect the ends of the open curves with lines in the plane and create edges with the lines. Next, the tool asks the geometry engine to make faces out of the closed result of the curves and the lines in the plane. Next, the tool asks the geometry engine to remove the rest of the large surface. Finally, the tool calls the geometry engine's merge function.

At step 1228, a solid with an enclosed surface is merged into a single solid. To do this, the tool calls the geometry engine's (220) split function, passing it all the surfaces in the set without checking the validity of the resultant body. The split function splits all the surfaces in the set by each other and returns a temporarily invalid body. Next, the tool asks the geometry engine to find all manifold (i.e., closed) pieces, or those that have a defined inside and outside. Next, the tools asks the geometry engine to find and remove all laminar (i.e., open) pieces. Next, the tool asks the geometry engine to find and remove all faces common to closed bodies, which returns one closed body with extra edges. Finally, the tool calls the geometry engine's merge function, checking the validity of the resultant body to remove redundant edges The geometry engine returns one closed solid body. The original surfaces are then deleted unless the Keep Cutter option is selected.

FIG. 13 shows the detailed logic for splitting a solid Target with an intersecting Cutter.

At step 1310, the combine tool checks that the Cutter matches one of the cases shown in steps 1312-1315. Step 1312 is the case of a plane that intersects the solid. Step 1313 is the case of a cutter that is a solid. Step 1314 is the case of a cutter that is a surface that encloses a volume of the target solid. Step 1315 is the case of a cutter that is an intersecting surface. If the Target set does not match one of those cases, the set is discarded (step 1311) and the tool returns to step 1116, shown in FIG. 11.

Once the Target is split in steps 1316-1319, and the Cutter is deleted or kept in steps 1320-1321, then the Select Regions sub-tool is activated, and the user can optionally delete Target regions in steps 1323 and 1327.

At step 1316, a Target solid is split by a plane Cutter. To do this, the tool asks the geometry engine to substitute a very large planar surface for the plane object. Then it calls the geometry's engines split function without the body checking parameter.

At step 1317, a Target solid is split by a solid Cutter. To do this, the tool calls the geometry engine's split function without the body checking parameter. Then it asks the geometry engine to find all manifold (i.e., closed) pieces in the Target. Finally, the tool asks the geometry engine to delete the Cutter.

At step 1318, material is removed from a Target solid by a Cutter which is a surface that encloses a volume of the Target solid. To do this, the tool calls the geometry engine's (220) split function, passing it all the surfaces in the set without the body checking parameter. The split function splits all the surfaces in the set by each other and returns a temporary, invalid body. Next, the tool asks the geometry engine to find all manifold (i.e., closed) pieces, or those that have a defined inside and outside. Next, the tools asks the geometry engine to find and remove all laminar (i.e., open) pieces. Next, the tool asks the geometry engine to find all sequentially neighboring faces of the cutter surface and mark only those as common for removal. This step is crucial, as it ensures that the result of the operation has enough faces to be a closed, solid body at the end. Next, the tool asks the geometry engine to find and remove all faces common to closed bodies and return one closed body with extra edges. Finally, the tool calls the geometry engine's merge function with the body checking parameter to remove edges. The geometry engine returns one closed solid body.

At step 1319, a Target solid is split by an intersecting surface Cutter. To do this, the tool calls the geometry engine's (220) split function, this time making sure that the resultant bodies are valid.

At step 1320, the combine tool checks to see if the user selected the Keep Cutter option. If this option is selected, then on completion of the tool, the Cutter is not deleted. If this option is not selected, the tool deletes the Cutter object (step 1321), then waits for a user action.

If the user Ctrl+clicks another object (step 1324), the tool returns to step 1310. This workflow allows the user to quickly split the same Target solid with multiple Cutters. If the user clicks a region of the Target created by the split (step 1323), that region is deleted. The user can delete multiple Target regions. If they delete all the regions, the tool jumps to step 1112, shown in FIG. 11. On completion of the operation (step 1322), the tool checks to see if the user selected the Merge When Done option (step 1325).

At step 1325, if the user selected the Merge When Done option, then for each component, the tool merges all the Target regions that touch each other. If the user did not select the option, then the tool removes the region highlighting at 1326 and returns to step 1112, shown in FIG. 11.

FIG. 14 shows the detailed logic for splitting a surface Target with an intersecting Cutter.

At step 1410, the combine tool checks that the Cutter matches one of the cases shown in steps 1412-1415. If the Target set does not match one of those cases, the set is discarded (step 1411) and the tool returns to step 1116, shown in FIG. 11. At steps 1412-1415, the combine tool determines which case the Cutter represents. Once the Target is split in steps 1416-1421, and the Cutter is deleted or kept in steps 1422-1423, then the Select Regions sub-tool is activated, and the user can optionally delete Target regions in steps 1425 and 1429.

At step 1416, two surface Cutters that partially intersect the Target surface are merged to form one surface Cutter that fully intersects the Target surface. This is not known to exist in any other CAD tools, since the tools are fundamentally limited to cases of well-defined intersections. At step 1417, the Target surface is split by the merged Cutter surface and the Cutter is deleted (step 1422). To do this, the tool calls the geometry engine's split function without the body checking parameter, passing it all the surfaces. Then the tool asks the geometry engine to find all the manifold groups, mark those that came from the target and those that came from the cutters. Then the tool asks the geometry engine to remove all the groups that came from cutters, leaving just the pieces that came from the target. The operation is made possible by the interim result being allowed to be invalid until a full intersection (from multiple contributors) with the target is well-defined.

At step 1418, a Target surface is split by a planar Cutter. To do this, the tool asks the geometry engine to substitute a very large planar surface for the plane object. Then it calls the geometry engine's split function.

At step 1419, a Target surface is split by a solid Cutter. To do this, the tool calls the geometry engine's split function without the body checking parameter and prompts the user for a region for deletion. Finally, the tool asks the geometry engine to delete the Cutter.

At step 1420, a Target surface is split by an intersecting surface Cutter. At step 1421, the surface Cutter is split by the Target surface. To do this, the tool calls the geometry engine's split function without the body checking parameter and passes it both surfaces.

At step 1423, the combine tool checks to see if the user activated the Keep cutter option. If this option is selected, the tool waits for a user action. If this option is not selected, the tool deletes the Cutter object (step 1422), then waits for a user action.

If the user Ctrl+clicks another object at this point (step 1426), the tool returns to step 1410. This workflow allows the user to quickly split the same Target surface with multiple Cutters. If the user clicks a region of the Target created by the split (step 1425), that region is deleted. The user can delete multiple Target regions. If they delete all the regions, the tool jumps to step 1112, shown in FIG. 11. If the user clicks outside a Target region (step 1424), the tool checks to see if the user activated the Merge when done option (step 1427).

At step 1427, if the user selected the Merge when done option, then for each component, the tool merges all the Target regions with shared edges. If the user did not select the option, then the tool removes the region highlighting and returns to step 1112, shown in FIG. 11.

FIG. 15 shows the detailed logic for splitting a solid Target with its own face(s).

At steps 1510 and 1511, the user may have selected either a set of faces or an edge loop. (An edge loop is a set of edges that completely encompasses a set of solid faces that define a region.) At step 1512, the user activates the Split Body combine tool.

At step 1513, the tool checks to see if the selection set is valid. Valid sets are one or more faces, or an edge loop. If there are no objects selected or if the selected objects are not valid, the tool waits for the user to click an object, as shown in step 1514. If the selection set is valid, the tool sets the body that owns the selected face(s) or edge loop as the Target (step 1516), and sets the selected face(s) or the face that owns the edge loop as the Cutter (step 1517). For each face, it is known which body is the parent, as a property of the face. A query to the geometry engine can return the parent body of a face. Multiple faces are merged along their common edges to form a single cutter in step 1518.

At step 1519, the tool checks to see if the user activated the Extend faces option. If this option is not selected, the tool fills any internal edge loops that define faces within the selected faces (step 1520), and then splits the body by extending all the faces contained within the Cutter (step 1524). To do this, the tool calls the geometry engine's split function without the body checking parameter.

If the Extend faces option is selected, then at step 1521, the tool checks to see if the faces are touching using the geometry engine. If they do not touch, then the tool splits the body by extending all the faces contained within the Cutter (step 1524). If they do touch, then the tool merges the touching faces into the Cutter (step 1522) and splits the body by extending only the outside edges of the Cutter (step 1523). Once the body is split in step 1523 or 1524, the tool returns to step 1425, shown in FIG. 14.

Embodiments of the invention can also be applied to various other types of objects within the CAD system, including split curves. Further, the methods can be applied to patterns of objects, where changes to a single object can be applied to a group of objects in a similar manner. This can be done by repetitively applying the changes to one object in a translated manner to other objects within the pattern group.

According to one embodiment of the invention, we have provided a tool within a three-dimensional modeling software application that, given any intersecting surfaces or solids (or a single solid that can be split by its faces) can merge or split those solids and surfaces.

While the above description contains many specificities, these should not be construed as limitations on the scope of any embodiment, but as exemplifications of the presently preferred embodiments thereof. Many other ramifications and variations are possible within the teachings of the various embodiments.

What is claimed is:

1. A method of cutting geometry-only format CAD objects stored within a computer aided design modeling system operating on a computer system comprising memory, a processor, an input device, and a monitor, and without related history information, using a single geometry modification tool and interface for splitting geometry-only format CAD objects, comprising:
   (a) displaying on the monitor a plurality of CAD objects and a plurality of geometry modification tools, including the single geometry modification tool, within a graphical user interface of the computer aided design modeling system;
   (b) receiving an activation through a graphical user interface displayed on the monitor, from a user of the computer aided design modeling system, of a single geometry modification tool;
   (c) receiving a selection, from the user through the input device, of at least one face of a solid CAD object, while the single geometry modification tool is active;
   (d) automatically merging, the at least one face of a solid object, into a cutting object, based on the received selection from the user;
   (e) extending the edges of the cutting object to create a cutting plane;
   (f) inferring the solid CAD object based on the received selection of the face of the solid CAD object;
   (g) automatically cutting the solid CAD object into at least two distinct CAD objects using the extended cutting plane; and
   (h) displaying on the monitor the automatically generated CAD objects from the cut operation within the graphical user interface of the computer aided design modeling system.

2. The method of claim 1, wherein cutting the solid object using the extended cutting plane is done by extending all faces of the cutting plane.

3. The method of claim 1, wherein cutting the solid object using the extended cutting plane is done by extending only outside edges of the cutting plane.

4. The method of claim 1, wherein one of the two distinct CAD objects is deleted in response to receiving a further selection from user.

* * * * *